(12) United States Patent
Totzeck et al.

(10) Patent No.: US 7,423,727 B2
(45) Date of Patent: Sep. 9, 2008

(54) LITHOGRAPHIC APPARATUS AND DEVICE MANUFACTURING METHOD

(75) Inventors: Michael Totzeck, Schwabisch Gmund (DE); Bernd Peter Geh, Scottsdale, AZ (US); Skip Miller, Phoenix, AZ (US)

(73) Assignee: ASML Netherlands B.V. (NL)

( * ) Notice: Subject to any disclaimer, the term of this patent is extended or adjusted under 35 U.S.C. 154(b) by 149 days.

(21) Appl. No.: 11/041,873

(22) Filed: Jan. 25, 2005

(65) Prior Publication Data

US 2006/0164621 A1    Jul. 27, 2006

(51) Int. Cl.
  *G03B 27/64*    (2006.01)
(52) U.S. Cl. .......................................... 355/67; 355/71
(58) Field of Classification Search ................... 355/67, 355/71, 53
  See application file for complete search history.

(56) References Cited

U.S. PATENT DOCUMENTS

| 6,057,970 A | * | 5/2000 | Kim et al. ................... 359/721 |
|---|---|---|---|
| 6,310,679 B1 | | 10/2001 | Shiraishi ...................... 355/53 |
| 6,404,482 B1 | | 6/2002 | Shiraishi ...................... 355/53 |
| 6,636,349 B2 | * | 10/2003 | Takahashi et al. ........... 359/351 |
| 6,844,972 B2 | * | 1/2005 | McGuire, Jr. ............... 359/494 |
| 7,084,960 B2 | * | 8/2006 | Schenker et al. ............. 355/71 |
| 2005/0243222 A1 | * | 11/2005 | Maul et al. ..................... 349/5 |

* cited by examiner

*Primary Examiner*—Della J. Rutledge
(74) *Attorney, Agent, or Firm*—Sterne, Kessler, Goldstein & Fox PLLC.

(57) ABSTRACT

A lithographic apparatus includes a support structure configured to hold a patterning device, the patterning device configured to pattern a beam of radiation according to a desired pattern, a substrate table configured to hold a substrate and a projection system configured to project the beam as patterned onto a target portion of the substrate. The lithographic apparatus further includes a polarization modifier disposed in a path of the beam. The polarization modifier comprises a material having a radially varying birefringence.

20 Claims, 14 Drawing Sheets

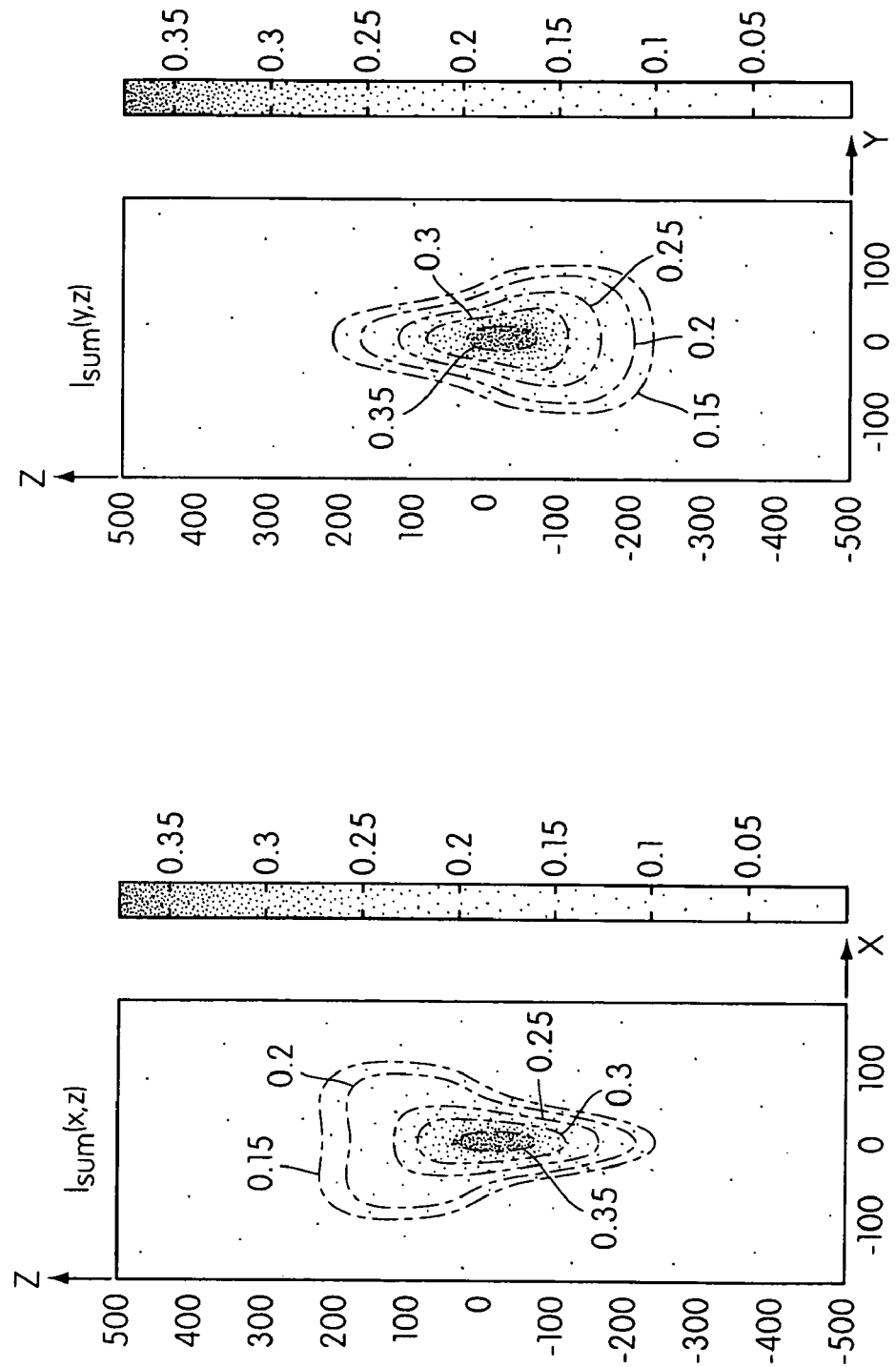

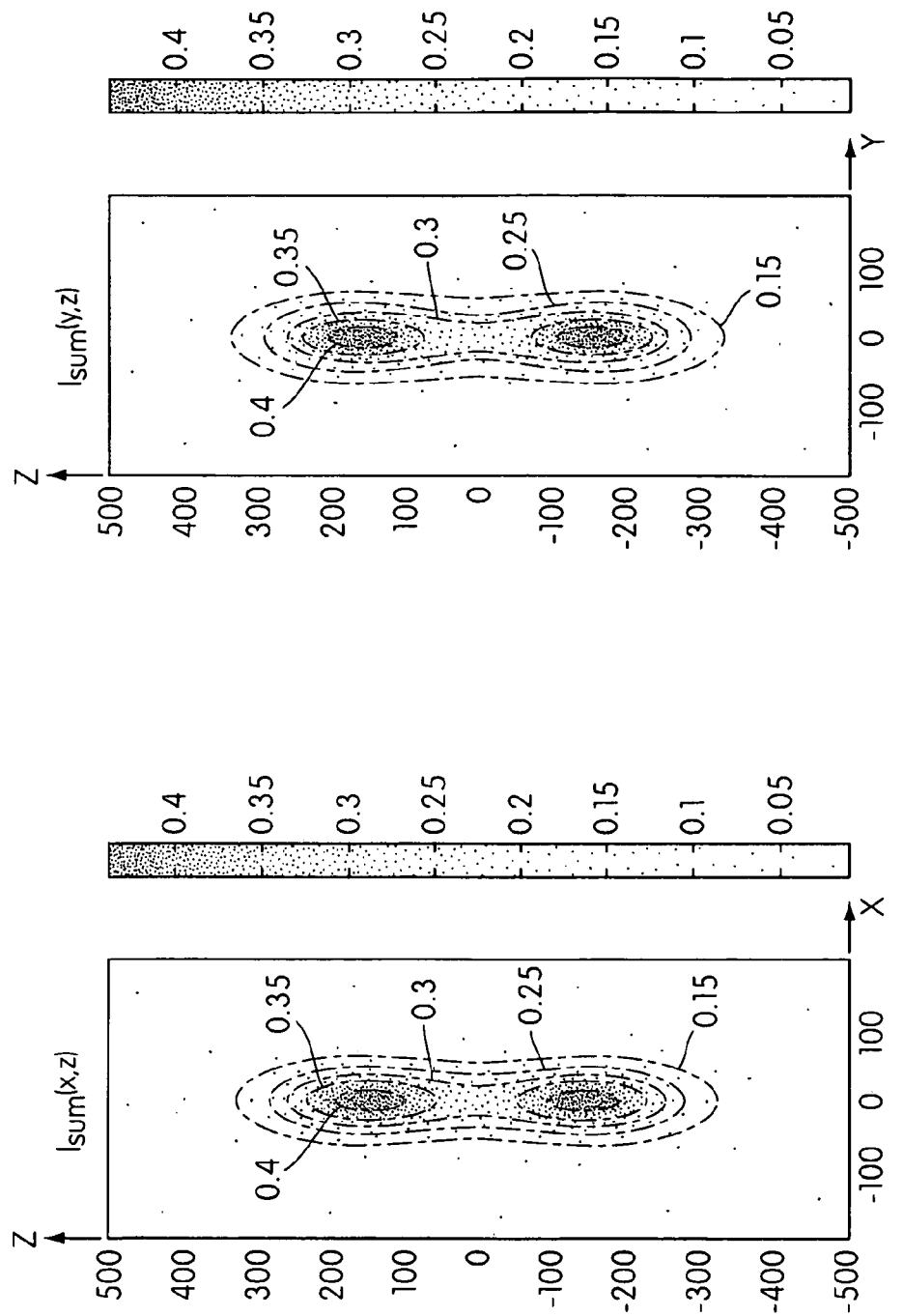

LITHOGRAPHIC APPARATUS AND DEVICE MANUFACTURING METHOD

BACKGROUND

1. Field

The present invention relates to a lithographic apparatus and a method of making a device.

2. Background

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

Development of new apparatus and methods in lithography have led to improvements in resolution of the imaged features, such as lines and contact holes or vias, patterned on a substrate, possibly leading to a resolution of less than 50 nm. This may be accomplished, for example, using relatively high numerical aperture (NA) projection systems (greater than 0.75 NA), a wavelength of 193 nm or less, and a plethora of techniques such as phase shift masks, non-conventional illumination and advanced photoresist processes.

However, certain small features such as contact holes are especially difficult to fabricate. The success of manufacturing processes at sub-wavelength resolutions will rely on the ability to print low modulation images or the ability to increase the image modulation to a level that will give acceptable lithographic yield.

Typically, the industry has used the Rayleigh criterion to evaluate the critical dimension (CD) and depth of focus (DOF) capability of a process. The CD and DOF measures can be given by the following equations:

$$CD = k_1(\lambda/NA),$$

and $$DOF = k_2(\lambda/NA^2),$$

where $\lambda$ is the wavelength of the illumination radiation, $k_1$ and $k_2$ are constants for a specific lithographic process, and NA is the numerical aperture.

Additional measures that provide insight into the difficulties associated with lithography at the resolution limit include the Exposure Latitude (EL), the Dense:Isolated Bias (DIB), and the Mask Error Enhancement Factor (MEEF). The exposure latitude describes the percentage dose range where the printed pattern's critical dimension (CD) is within acceptable limits. For example, the exposure latitude may be defined as the change in exposure dose that causes a 10% change in printed line width. Exposure Latitude is a measure of reliability in printing features in lithography. It is used along with the DOF to determine the process window, i.e., the regions of focus and exposure that keep the final resist profile within prescribed specifications. Dense:Isolated Bias is a measure of the size difference between similar features, depending on the pattern density. Finally, the MEEF describes how patterning device CD errors are transmitted into substrate CD errors.

Among the trends in lithography is to reduce the CD by lowering the wavelength used, increasing the numerical aperture, and/or reducing the value of k1. However, increasing the numerical aperture would also lead to a decrease in the DOF which ultimately could lead to limitations in process latitude. This can also be understood by combining the above two equations to obtain:

$$DOF = (k_2/k_1^2)(CD^2/\lambda).$$

From this equation it can be seen that a decrease in CD, i.e., an increase in resolution, would lead to a decrease in DOF which is unwanted in most lithographic processes and specifically in the process of printing contact holes.

SUMMARY

According to an aspect of the present invention, there is provided a lithographic apparatus including a support structure configured to hold a patterning device, the patterning device configured to pattern a beam of radiation according to a desired pattern, a substrate table configured to hold a substrate and a projection system configured to project the patterned beam onto a target portion of the substrate. The lithographic apparatus further includes a polarization modifier disposed in a path of the beam of radiation. The polarization modifier comprises a material having a radially varying birefringence.

According to another aspect of the present invention, there is provided a lithographic apparatus including a support structure configured to hold a patterning device, the patterning device configured to pattern a beam of radiation according to a desired pattern, a substrate table configured to hold a substrate and a projection system configured to project the patterned beam onto a target portion of the substrate. The lithographic apparatus further includes a polarization modifier disposed in a path of the beam of radiation. The polarization modifier comprises a material having a radially continuously varying birefringence.

According to yet another aspect of the present invention there is provided a method for manufacturing a device. The method includes projecting a patterned beam of radiation through a polarization modifier comprising a material having a radially varying birefringence onto a target portion of a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The methods described herein may be implemented as software, hardware or a combination. In an embodiment, there is provided a computer program comprising program code that, when executed on a computer system, instructs the computer system to perform any or all of the methods described herein.

BRIEF DESCRIPTION OF THE DRAWINGS

These and other aspects of the invention will become more apparent and more readily appreciated from the following detailed description of the present exemplary embodiments of the invention, taken in conjunction with the accompanying drawings, of which:

FIGS. 7A and 7B show intensity profiles of a projection beam at different focus points obtained, respectively, in the XZ plane and the YZ plane, for an immersion projection system using the polarization modifier of FIG. 5 in accordance with an embodiment of the invention;

FIGS. 9A and 9B show intensity profiles of an illumination beam at different focus points obtained, respectively, in the XZ plane and the YZ plane, for an immersion projection system using a polarization modifier having circular birefringence in accordance with an embodiment of the invention;

DETAILED DESCRIPTION

Figure 1:
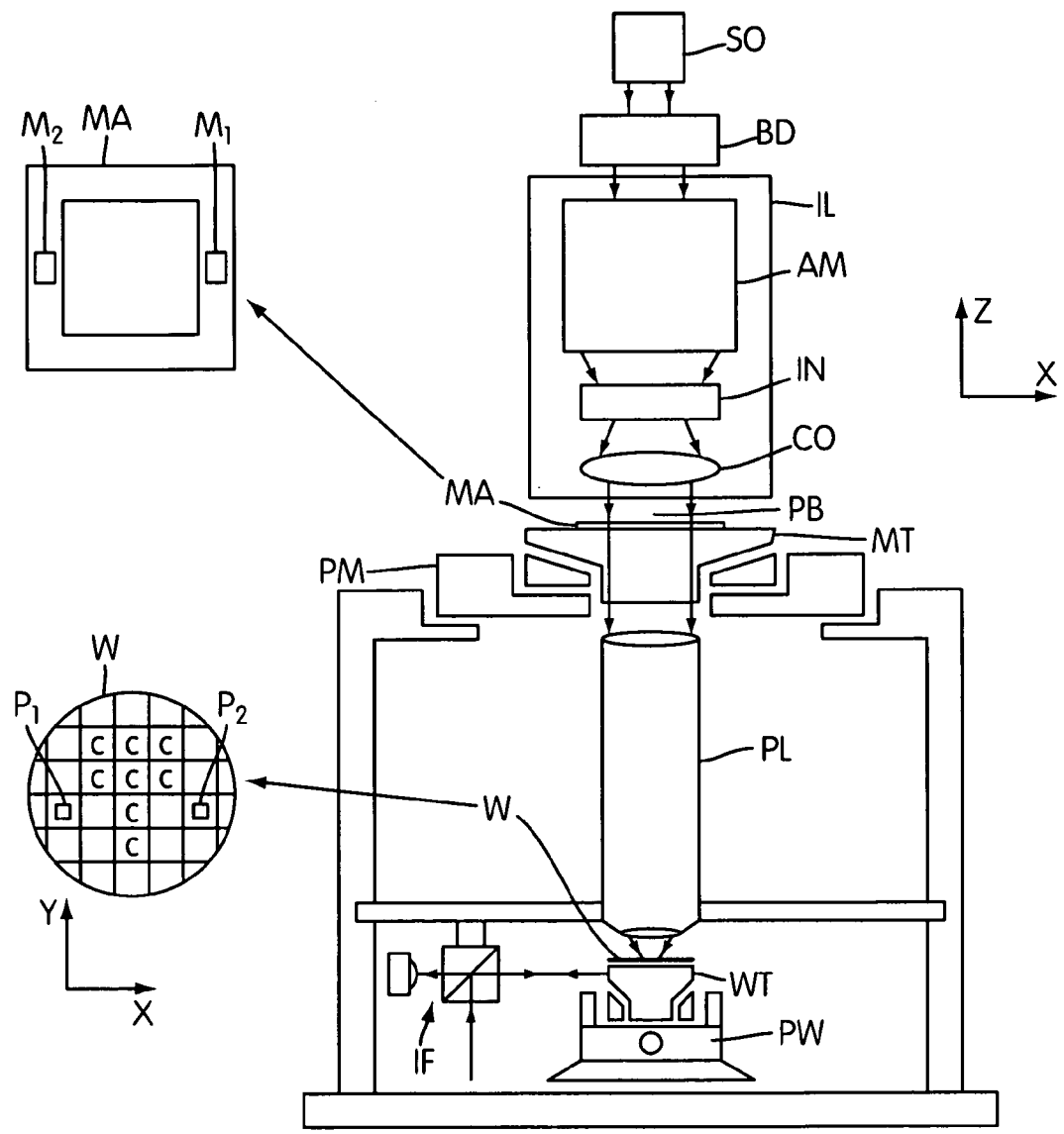
FIG. 1 schematically depicts a lithographic projection apparatus according to an embodiment of the invention.

FIG. 1 schematically depicts a lithographic apparatus according to a particular embodiment of the invention. The apparatus comprises:

- an illumination system (illuminator) IL adapted to condition a beam PB of radiation (e.g. UV radiation).
- a support structure (e.g. a mask table) MT configured to hold a patterning device (e.g. a mask) MA and connected to first positioning device PM configured to accurately position the patterning device with respect to item PL;
- a substrate table (e.g. a wafer table) WT configured to hold a substrate (e.g. a resist-coated wafer) W and connected to second positioning device PW configured to accurately position the substrate with respect to item PL; and
- a projection system (e.g. a refractive projection lens) PL adapted to image a pattern imparted to the beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the patterning device MA, which is held on the support structure MT. Having traversed the patterning device MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the support structure MT and the substrate table WT will be realized with the aid of a long-stroke module (coarse positioning) and a short-stroke module (fine positioning), which form part of the one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2. The depicted apparatus can be used in the following preferred modes:

1. In step mode, the support structure MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

When a high numerical aperture is used for a projection system, for example a numerical aperture of 0.93 for a dry projection system using unpolarized illumination, to increase the resolution, this can lead to a depth of focus that is symmetrical but relatively small.

Figures 3A, 3B:
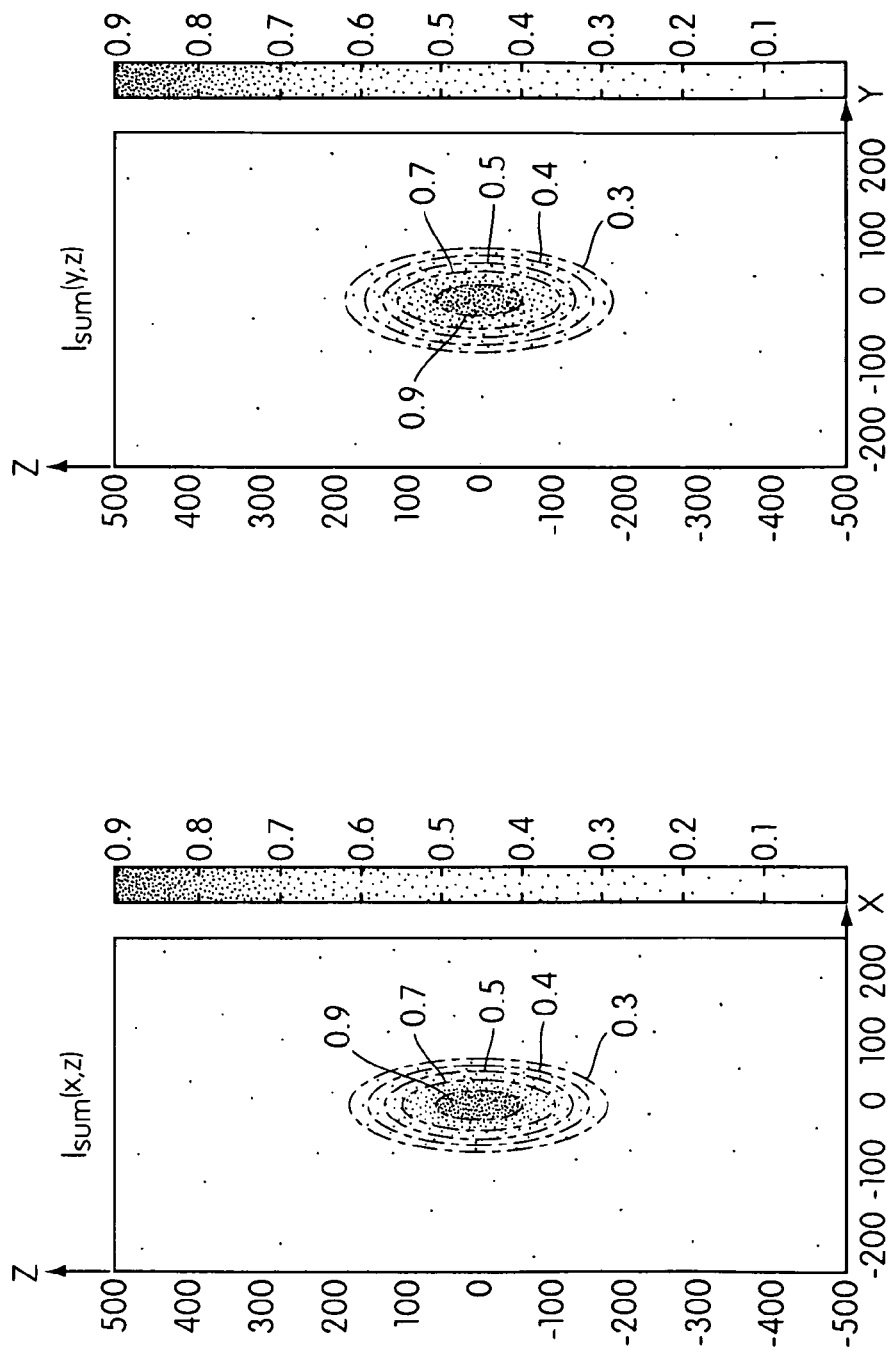
FIGS. 3A and 3B show intensity profiles of a projection beam at different focus points obtained, respectively, in the XZ plane and the YZ plane, for a dry projection system.

This is illustrated, for example, in FIGS. 3A and 3B which show the results of a simulation of a three dimensional focus of a projection system with a numerical aperture of 0.93 on a resist material having a refractive index of 1.8 and with a refractive index of the medium between the projection system and the substrate equal to about 1 (i.e., a dry projection system). In the simulation, a perfect projection system, i.e., a projection system without aberrations, is assumed and all simulations are performed at a radiation wavelength of 193.36 nm. However, it should be appreciated that the above and other parameters herein are only one possible set of parameters and other possible sets of parameters are within the scope of the present invention. For example, the wavelength can be selected to be a different wavelength value such as, for example, about 157 nm.

Figure 2:
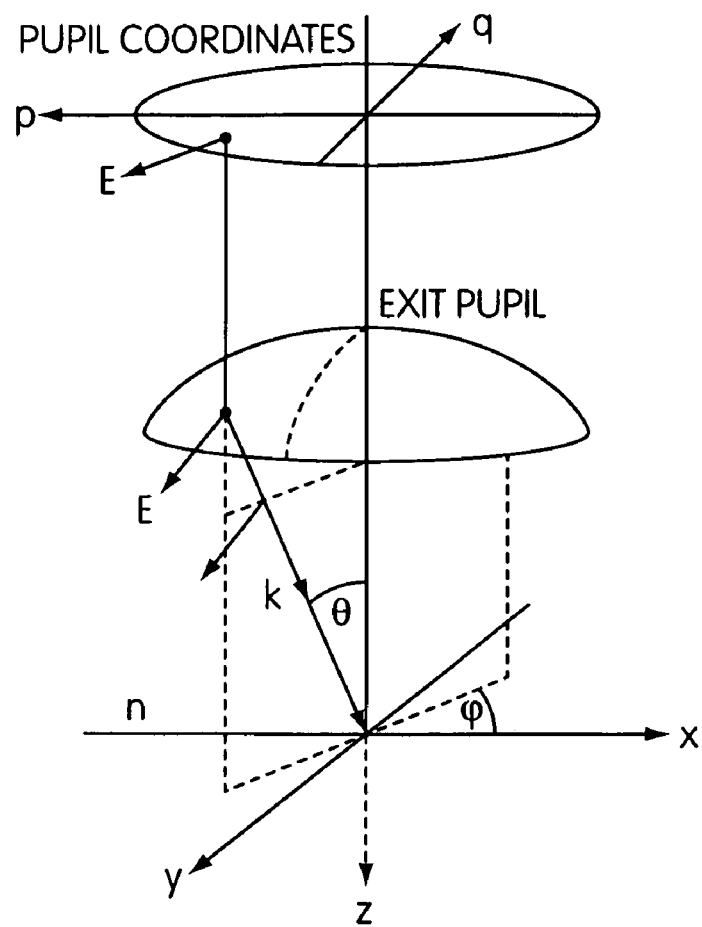
FIG. 2 depicts a geometry for focus computation used in calculating a depth of focus according to an embodiment of the invention.

For purposes of the present description, it is assumed that the substrate with the resist layer is lying in the XY plane and the projection beam propagates along the Z coordinate. FIG. 2 shows a geometry for focus computation in which the coordinates (p, q) represent the pupil coordinates, E is the electromagnetic field vector, k is the propagation vector, θ is the angle representing the focus of a beam of radiation by the projection system, represented schematically in FIG. 2 by a lens at an exit pupil, φ is the azimuthal angle between the plane formed by the vectors E and k and the X coordinate and n is the refractive index of the medium through which the beam of radiation passes to reach a surface of a substrate (in plane XY).

FIG. 3A shows an intensity profile of the projection beam at various focus points around the best focus in the XZ plane and FIG. 3B shows an intensity profile of the projection beam at various focus points around the best focus in the YZ plane. The position of the focus points are mapped in three coordinates X, Y and Z with the Z coordinate representing the range of focus (e.g., depth of focus), and the intensity at each focus point (X, Y, Z) is given by a shade of color or gray. The darkest shade of gray or color at the center of the intensity profile corresponds to the maximum intensity (the intensity is approximately 0.9). The color or gray scale on the right of FIG. 3A and FIG. 3B gives a measure of the intensity.

In the results of the simulation shown in FIGS. 3A and 3B, the depth of focus, which is the total range of focus that can be tolerated, that is, the range of focus that keeps the resulting printed feature within a variety of specifications (such as line width, sidewall angle, resist loss, and/or exposure latitude), is between about −200 and about 200 in the Z coordinate with the best focus being at 0.

Figures 4A, 4B:
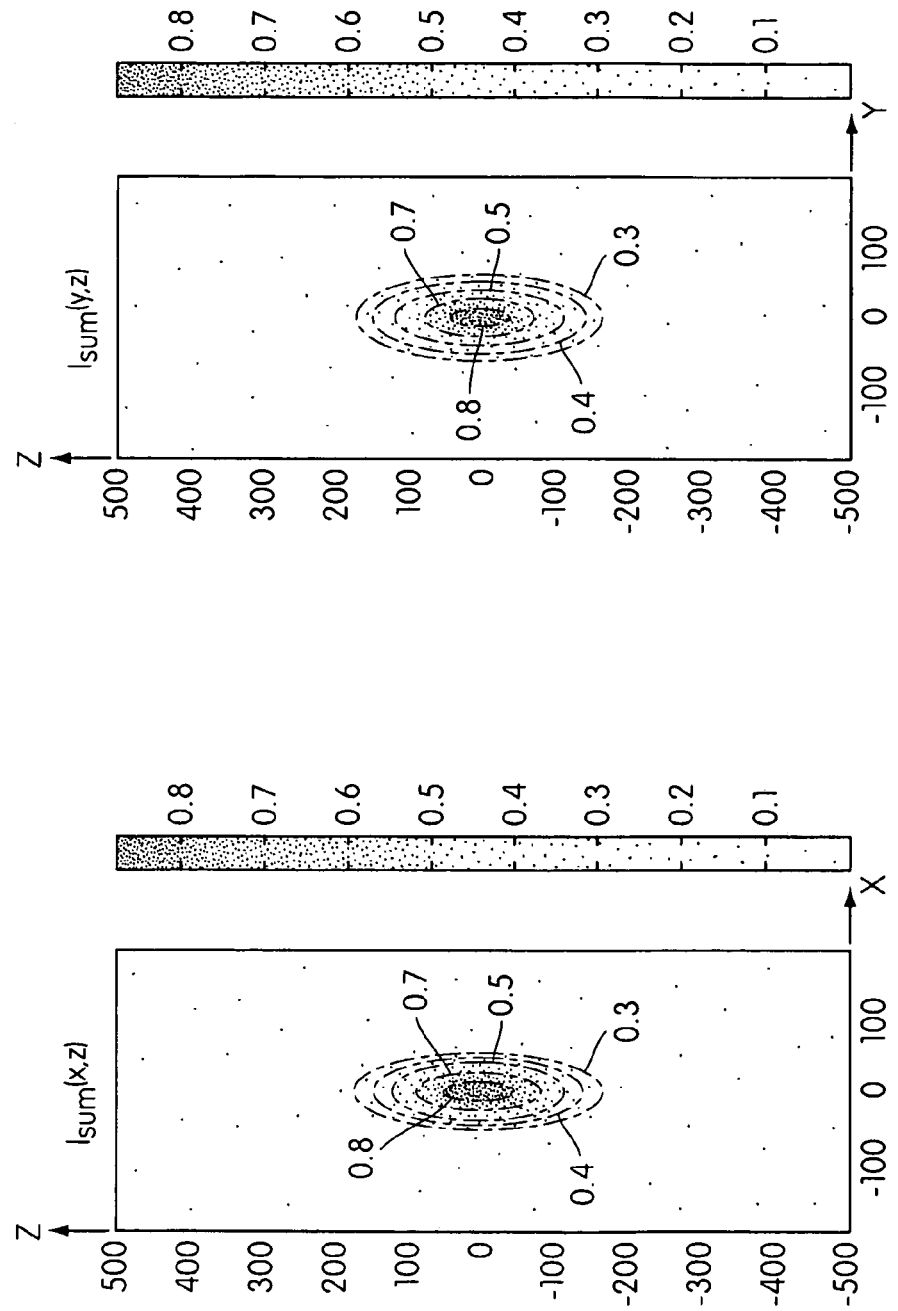
FIGS. 4A and 4B show intensity profiles of a projection beam at different focus points obtained, respectively, in the XZ plane and the YZ plane, for an immersion projection system.

When the numerical aperture is increased to 1.2, for example by simulating the use of water (with a refractive index of 1.44) as an immersion liquid between the projection system and the substrate, the intensity profiles obtained previously through the simulation are altered as shown in FIGS. 4A and 4B.

FIG. 4A shows an intensity profile of the projection beam at various focus points around the best focus in the XZ plane and FIG. 4B shows an intensity profile of the projection beam at various focus points around the best focus in the YZ plane. The position of the focus points are mapped in three coordinates X, Y and Z with the Z coordinate representing the range of focus and the intensity at each focus point (X, Y, Z) is given by a shade of color or gray. The darkest shade of gray or color at the center of the intensity profile represents the maximum intensity (the intensity is approximately 0.8). The color or gray scale on the right of FIG. 4A and FIG. 4B gives a measure of the intensity.

In the results of the simulation shown in FIGS. 4A and 4B, the depth of focus is between approximately −200 and approximately 200 in the Z coordinate with the best focus being at 0. A small depth of focus reduces the process window for a given process. This problem may become more acute when the process includes imaging contact holes which are 3 dimensional in nature as imaging of contact holes may require more careful considerations in terms of process window.

To improve the depth of focus, it is proposed to use polarization to increase the depth of focus. This is accomplished by displacing two orthogonally polarized foci laterally with respect to each other. The superposition of the two orthogonally displaced foci forms a combined focus with increased depth of focus.

In an embodiment of the invention, a polarization modifier with radially varying (for example, increasing) linear birefringence, formed from a linearly birefringent material, is introduced into the imaging system to increase the depth of focus. In an embodiment, such a polarization modifier is a retarder.

A linearly birefringent material, such as calcite ($CaCO_3$), will divide an entering beam of monochromatic radiation into two beams having orthogonal polarizations. The beams will propagate in different directions and have different propagation speeds. Depending on whether the birefringent material is uniaxial or biaxial, there will be one or two directions within the material along which the beams will remain co-linear and continue to propagate with the same speed. These directions are called the optic axes directions. For example, if the material is a plane-parallel plate, and the beam is not collinear with the optic axes directions, the radiation will emerge as two separate, orthogonally polarized beams. The two beams within the birefringent crystal are referred to as the ordinary ray and extraordinary ray, respectively. The polarization of the extraordinary ray lies in the plane containing the direction of propagation of the beam and the optic axis, and the polarization of the ordinary ray is perpendicular to this plane.

Figure 5:
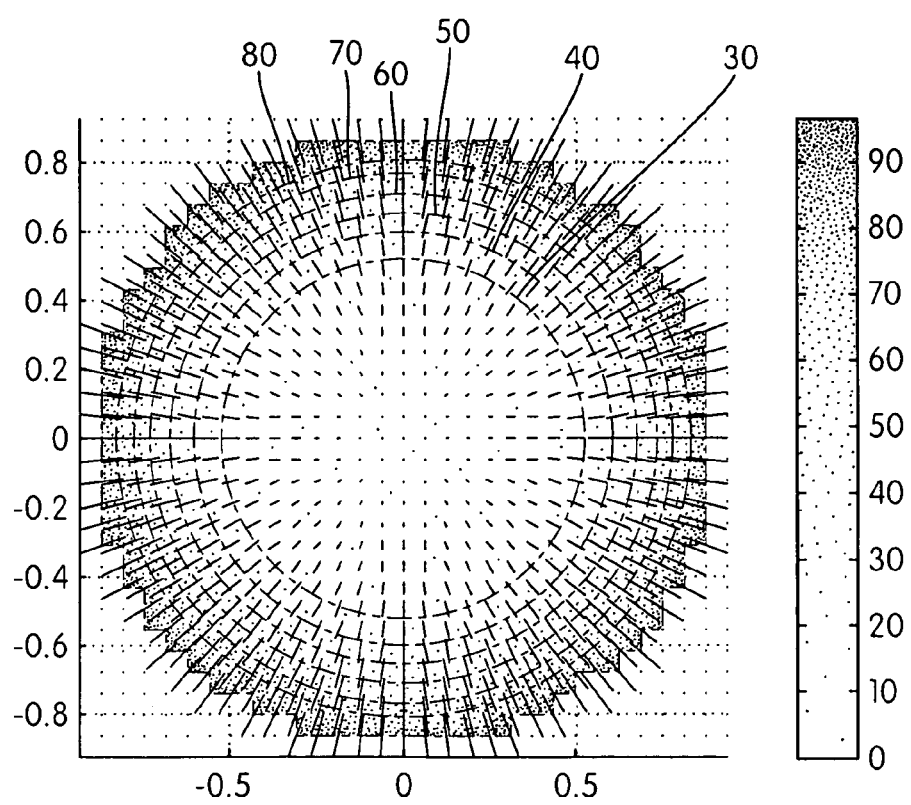
FIG. 5 depicts a polarization modifier having a radially increasing linear birefringence according to an embodiment of the invention.

FIG. 5 shows a polarization modifier having radially increasing (for example, quadratically increasing) linear birefringence. The color or grayed scale on the right of FIG. 5 gives a measure of the magnitude of birefringence with the lowest value being 0 and the highest value being 100. The magnitude of the birefringence as a function of the pupil coordinates p and q is given by:

$$\Delta n = \exp\left\{i\Delta\varphi_0 \frac{p^2 + q^2}{NA^2}\right\}$$

and the orientation α is given by:

$$\tan\alpha = \frac{q}{p}$$

where n is the refractive index of the birefringent material of the polarization modifier, $\Delta n$ is the variation of the refractive index in the (p, q) coordinates, i is the imaginary number, NA is the numerical aperture and $\Delta\phi_0$ is the value of the retardance at the rim of the aperture.

Figures 6A, 6B:
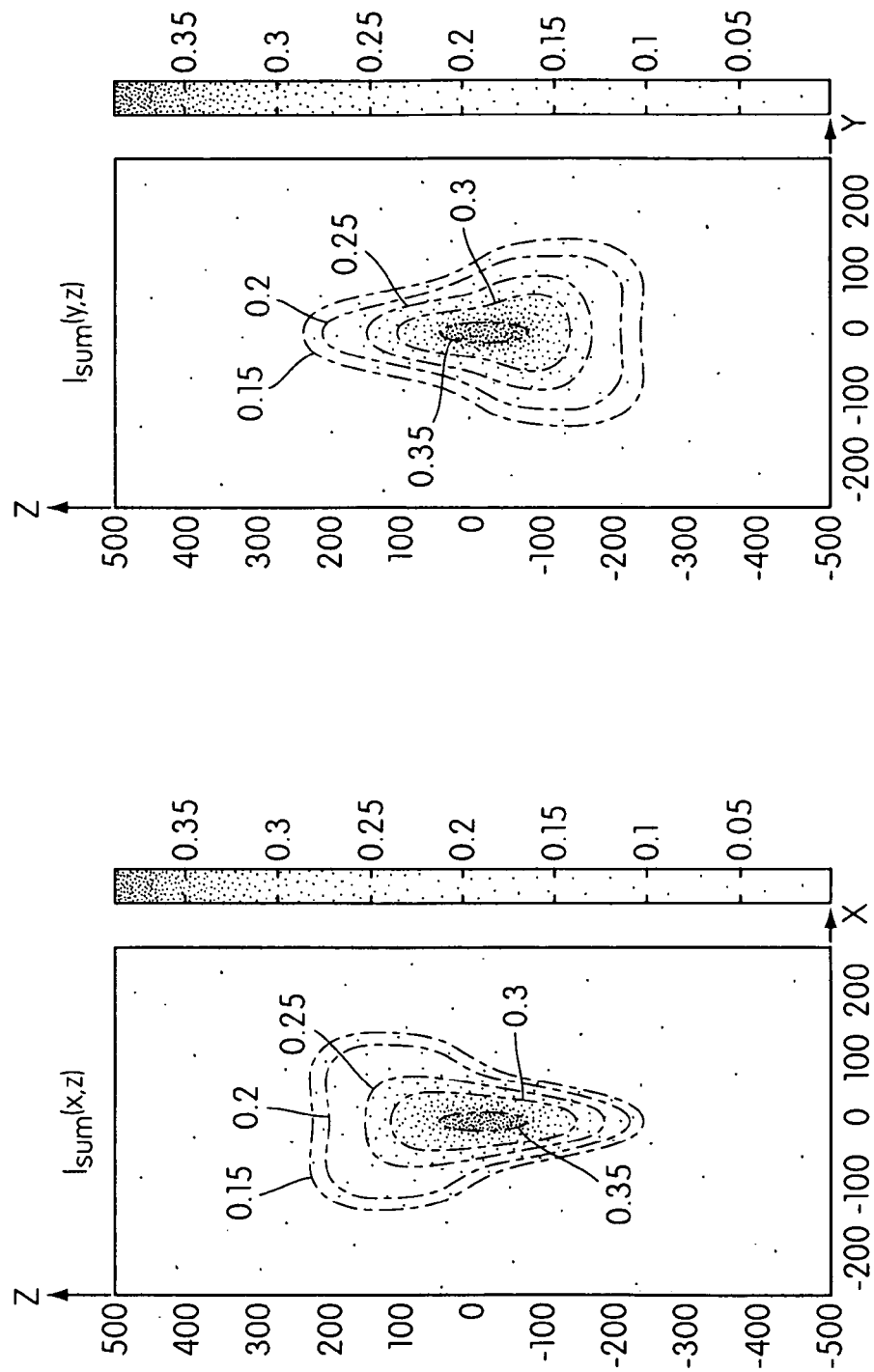
FIGS. 6A and 6B show intensity profiles of a projection beam at different focus points obtained, respectively, in the XZ plane and the YZ plane, for a dry projection system using the polarization modifier of FIG. 5 in accordance with an embodiment of the invention.

The results of a simulation using the polarization modifier of FIG. 5 are presented in FIGS. 6A and 6B for a projection system with a numerical aperture of 0.93 on a resist material having a refractive index of 1.8 and with a refractive index of the medium between the projection system and the substrate equal to about 1 (i.e., a dry projection system). In the simulation, a perfect projection system, i.e., a projection system without aberrations, is assumed and all simulations are performed at a wavelength of 193.36 nm. FIG. 6A shows an intensity profile of the projection beam at various focus points around the best focus in the XZ plane and FIG. 6B shows an intensity profile of the projection beam at various focus points around the best focus in the YZ plane. In FIG. 6A, it can be seen that the upper focus points (for example, focus points around a Z of 200) are elongated in the X direction. On the other hand, it can be seen in FIG. 6B that the lower focus points (for example, focus points around a Z of −200) are elongated in the Y direction. This is because a linear polarized focus is asymmetrical along the direction of polarization and perpendicular to the direction of polarization, i.e. the width of the focus is larger along the direction of polarization than along a direction perpendicular to the direction of polarization. Therefore, the upper focus is polarized along the X direction and the lower focus is polarized along the Y coordinate.

When the numerical aperture is increased to 1.2, for example by simulating the use of water (with a refractive index of 1.44) as an immersion liquid between the projection system and the substrate, the intensity profiles obtained in the case of a dry projection system with a linear birefringent polarization modifier are modified as shown in FIGS. 7A and 7B. FIG. 7A shows an intensity profile of the projection beam at various focus points around the best focus in the XZ plane and FIG. 7B shows an intensity profile of the projection beam at various focus points around the best focus in the YZ plane. The asymmetric profile of the intensity of the focus remains generally the same as the one obtained in the case of a dry projection system.

However, the depth of focus remains generally the same or slightly increased in the Z direction when comparing the results obtained without using birefringence (FIGS. 3A and 3B) and the results obtained with the use of a linear birefringent polarization modifier (FIGS. 6A and 6B) in the case of a dry projection system. This trend can also be observed in the case of an immersion projection system where the results obtained without using birefringence (FIGS. 4A and 4B) and the results obtained with the use of a linear birefringent polarization modifier (FIGS. 7A and 7B) show a depth of focus in the Z direction which remains generally unchanged or slightly increased. Consequently, the use of a linear birefringent polarization modifier does not substantially increase the depth of focus but does enhance the width of focus in the X and Y directions.

To improve depth of focus, a polarization modifier with circular birefringence (for example, a pupil filter with circular birefringence) is introduced into the projection system instead of a polarization modifier with linear birefringence. This is motivated by the fact that, contrary to the non-symmetrical nature of a focus of a linearly polarized wave, the focus of a circularly polarized wave is symmetrical.

Contrary to a material exhibiting a linear birefringence (such as calcite) in which there exist a direction or directions where the ordinary (O) and the extraordinary (E) ray are equal, in a material exhibiting circular birefringence (such as quartz) there is no such direction(s). The direction of the optical axis for circular birefringent crystals is the direction in which the difference in the indices for the O and E ray is a minimum. For example, if a quartz plate is cut such that its optic axis is normal to the surfaces of the plate, and a ray of linearly polarized light is incident parallel to the optic axis, the ray will be separated into two collinear, circularly polarized rays. The ordinary (O) and the extraordinary (E) rays will have opposite senses of circular polarization and will travel at different speeds. The plane of polarization rotates about the optic axis as the beam penetrates the plate. The amount of rotation is directly proportional to the depth of penetration, and ultimately to the thickness of the plate. The superposition of two counter-rotating circular polarizations produces linear polarization without any intermediate elliptical polarization states. The polarization of the O and E rays in quartz rapidly changes from circular to elliptical even for directions which depart only slightly from the optical axis. For this reason, devices which depend on circular polarization are typically effective only when highly collimated radiation propagates parallel to the optical axis direction.

A polarization modifier with circular birefringence is an optical element that provides a retardance between left and right circular polarized radiation. In an embodiment, such an optical element is a rotator having the following Jones matrix:

$$J = \begin{pmatrix} \cos\beta & -\sin\beta \\ \sin\beta & \cos\beta \end{pmatrix}$$

where the rotation angle $\beta$ depends on the radial pupil coordinate (p, q), the numerical aperture NA, and the value of the rotation at the rim of the aperture $\beta_0$ according to the following equation:

$$\beta = \beta_0 \frac{p^2 + q^2}{NA^2}$$

Figures 8A, 8B:
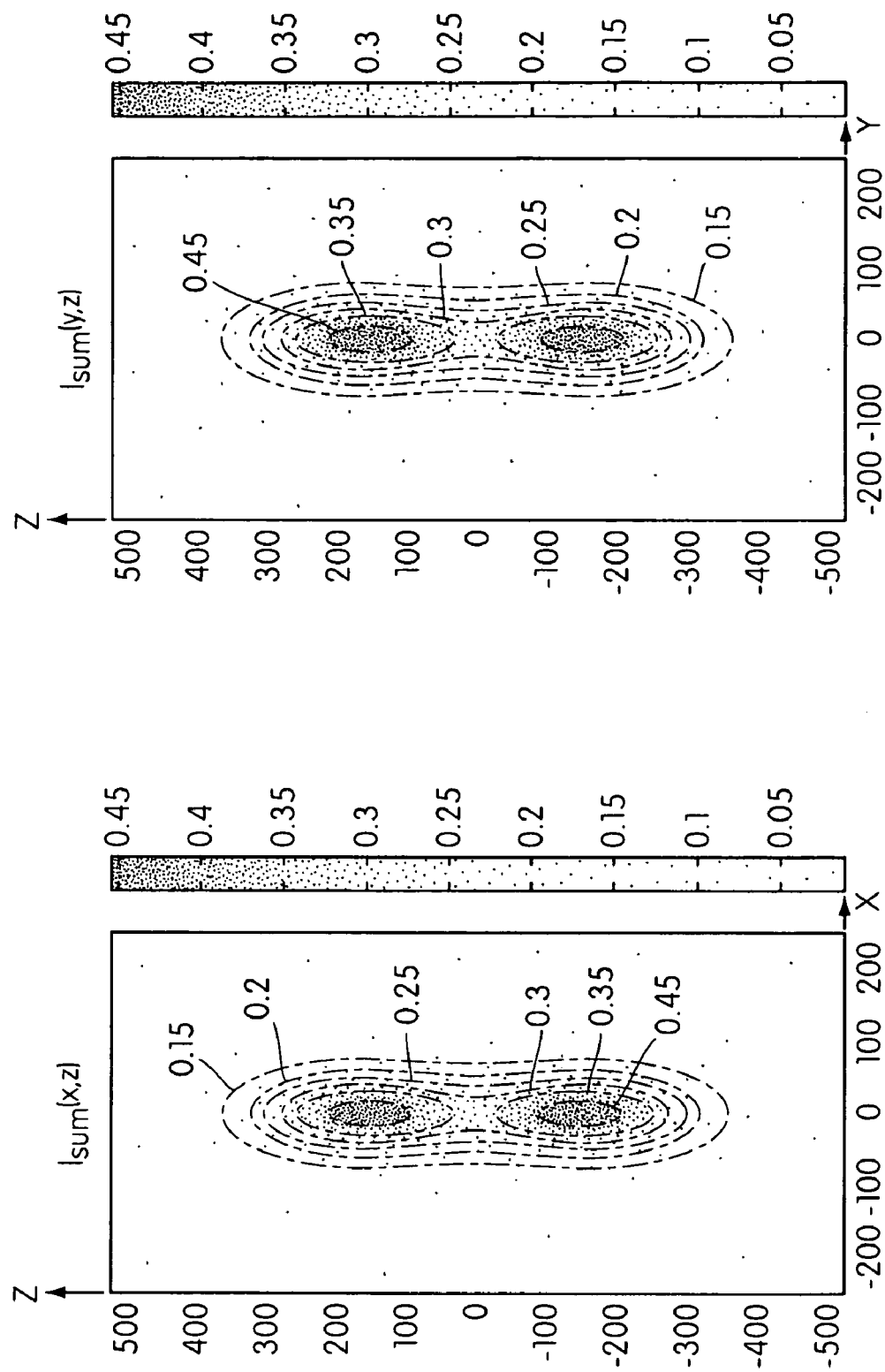
FIGS. 8A and 8B show intensity profiles of a projection beam at different focus points obtained, respectively, in the XZ plane and the YZ plane, for a dry projection system using a polarization modifier having circular birefringence in accordance with an embodiment of the invention.

In an embodiment, a simulation is performed with a numerical aperture NA equal to 0.93 (for a dry projection system) and equal to 1.2 (for an immersion projection system) and with a rotation at the rim of the aperture $\beta_0$ equal to $\pi$. The results of the simulation are presented in FIGS. 8A and 8B for a dry projection system and in FIGS. 9A and 9B for an immersion projection system. FIG. 8A shows an intensity profile of the projection beam at various focus points around the best focus in the XZ plane and FIG. 8B shows an intensity profile of the projection beam at various focus points around the best focus in the YZ plane. Similarly, FIG. 9A shows an intensity profile of the projection beam at various focus points around the best focus in the XZ plane and FIG. 9B shows an intensity profile of the projection beam at various focus points around the best focus in the YZ plane.

From the results, it can be seen that, for a dry projection system, the overall symmetry of the focus is preserved and in comparison with the depth of focus obtained using no birefringence (FIGS. 3A and 3B) or using a linear birefringent polarization modifier (FIGS. 6A and 6B), the depth of focus obtained using a circular birefringent polarization modifier (FIGS. 8A and 8B) has almost doubled. Similarly, for an immersion projection system, it can be seen that the overall symmetry of the focus is preserved and in comparison with the depth of focus obtained using no birefringence (FIGS. 4A and 4B) or using a linear birefringent polarization modifier (FIGS. 7A and 7B), the depth of focus obtained using a circular birefringent polarization modifier (FIGS. 9A and 9B) has almost doubled.

Figure 10A:
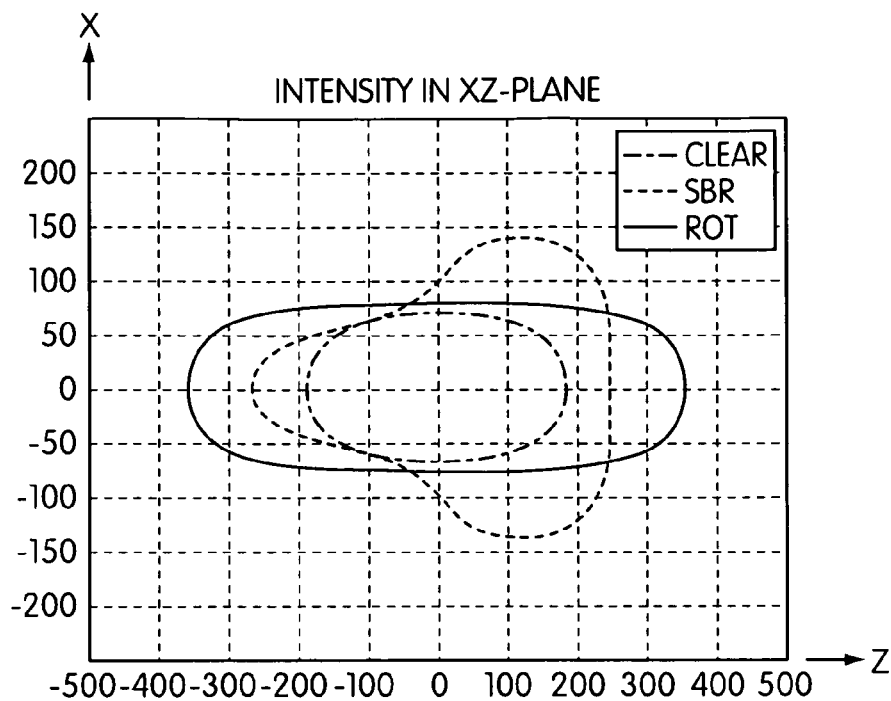
FIGS. 10A and 10B show an intensity contour map, respectively, in the XZ plane and the YZ plane, for various configurations including a system without birefringence, a system with a polarization modifier having linear birefringence and a system with a polarization modifier having circular birefringence.
Figure 10B:
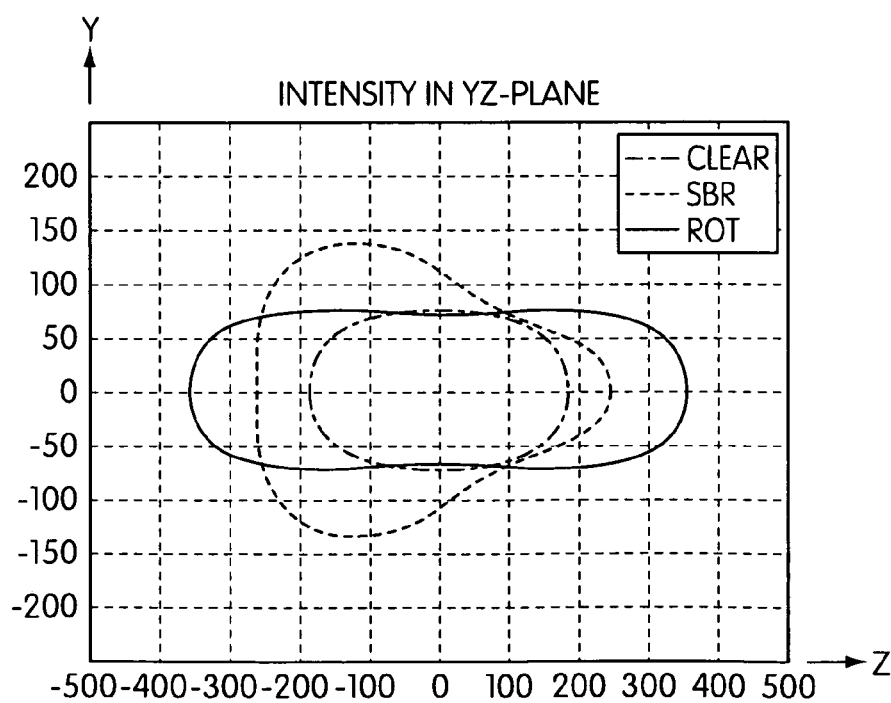

These results are further seen in FIGS. 10A and 10B which show an intensity contour map in XZ coordinates and YZ coordinates, respectively, for the above discussed configurations, i.e. without birefringence (labeled "clear"), with a linear birefringent polarization modifier (labeled "SBR") and with a circular birefringent polarization modifier (labeled "ROT"). The intensity contour map is taken at a normalized intensity value of 0.3 (normalized to the maximum intensity). As can be seen in FIGS. 10A and 10B, the contour that has a larger extension in the Z direction, i.e., a larger depth of focus, corresponds to the situation where a circular birefringent polarization modifier is used.

Figure 11A:
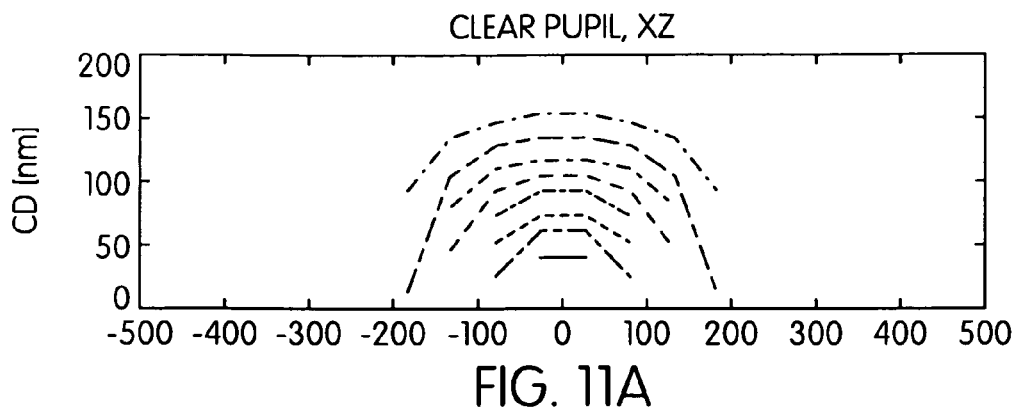
FIGS. 11A, 11B and 11C show plots of Bossung curves for a dry projection system in the XZ plane, for a system without birefringence, a system with a polarization modifier having linear birefringence and a system with a polarization modifier having circular birefringence, respectively.
Figure 11B:
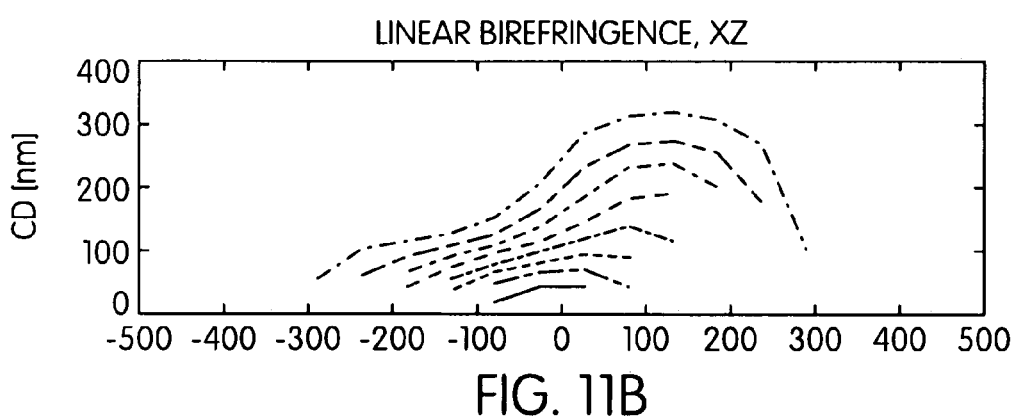
Figure 11C:
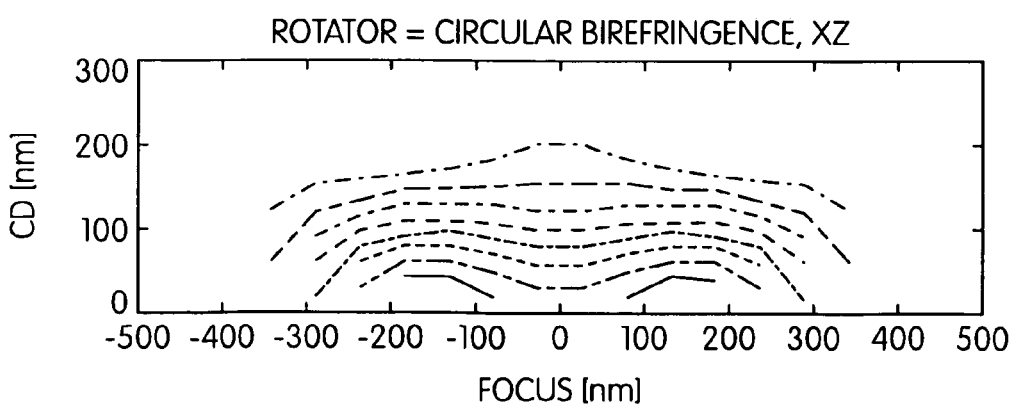

FIGS. 11A, 11B and 11C show plots of Bossung curves for a dry projection system in the XZ plane, for the above discussed three configurations, i.e. without birefringence, with a linear birefringent polarization modifier and with a circular birefringent polarization modifier, respectively. Bossung curves describe a variation of linewidth (and possibly other parameters) as a function of both focus and exposure energy. The data is typically plotted as line width versus focus for different exposure energies. From the Bossung curves, it can be seen that the depth of focus (abscissa in the plots) is larger (from about −400 nm to about 400 nm at the highest exposure intensity) and the CD (ordinate in the plots) is substantially symmetric around the best focus position (focus position is 0) when using a circular birefringent polarization modifier (see FIG. 11C). On the other hand, while it can be seen that the depth of focus is broad (from about −300 nm to about 300 nm) when using a linear birefringent polarization modifier, the CD is, however, not symmetrical around the best focus position (see FIG. 11B). In this case, it can be noted that the CD is small (about 100 nm for the highest exposure intensity) for negative values of the focus and larger (about 300 nm for the highest exposure intensity) for positive values of the focus (see FIG. 11B). In the case of no birefringence, the CD is substantially symmetrical around the best focus (with a CD value of about 150 nm) but the depth of focus is smaller (extending between about −200 nm and about 200 nm for the highest exposure intensity) (see FIG. 11A) compared to the depth of focus obtained when using a circular birefringent polarization modifier (rotator).

Figure 12A:
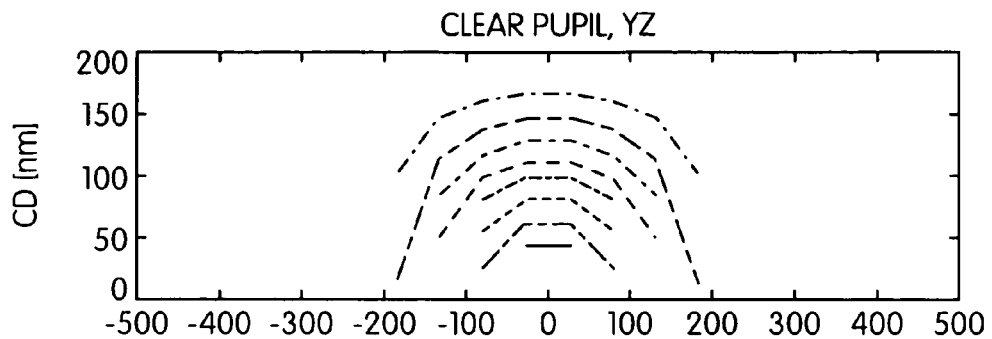
FIGS. 12A, 12B and 12C show plots of Bossung curves for a dry projection system in the YZ plane, for a system without birefringence, a system with a polarization modifier having linear birefringence and a system with a polarization modifier having circular birefringence, respectively.
Figure 12B:
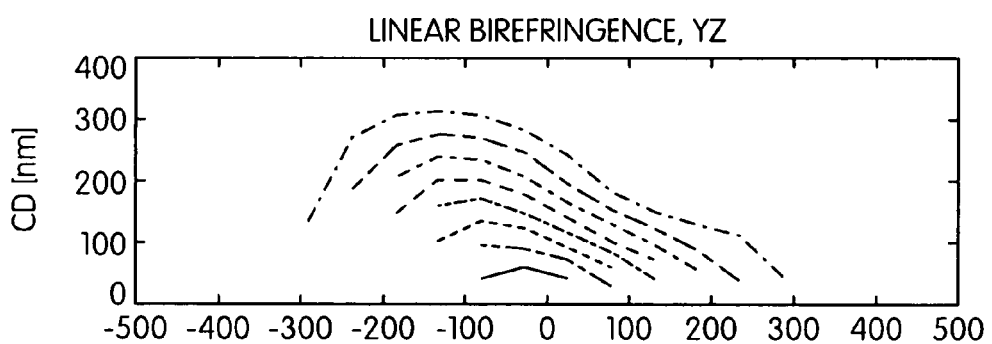
Figure 12C:
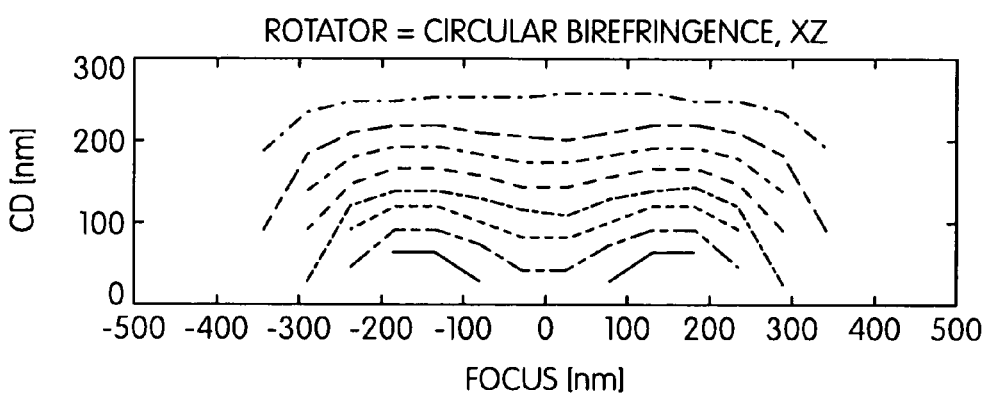

FIGS. 12A, 12B and 12C show plots of Bossung curves for a dry projection system in the YZ plane, for the above discussed three configurations, i.e. without birefringence, with a linear birefringent polarization modifier and with a circular birefringent polarization modifier, respectively. Similarly, to the results shown in FIGS. 11A, 11B and 11C, the Bossung curves in FIGS. 12A, 12B and 12C also show the same trend with the CD being substantially symmetric around the best focus when using a circular birefringent polarization modifier and not symmetric around the best focus when using a linear birefringent polarization modifier and with the depth of focus using a circular birefringent polarization modifier being overall larger than using a linear birefringent polarization modifier or having in no birefringence.

Generally, there are two approaches for varying circular birefringence. One approach is varying the circular birefringence in the pupil plane of the projection system. In this case, a space variant element may be used to implement the variation of the circular birefringence in the pupil plane. A space variant element is an element where the rotation varies with the lateral or radial coordinate. Another approach is varying the circular birefringence in a field plane. In this case, an angular variant element may be used to implement the variation of the circular birefringence in the field plane. An angular variant element is an element where the rotation varies with the angle of propagation. In a field plane, different pupil coordinates are distinguished by their propagation angle.

Figure 13:
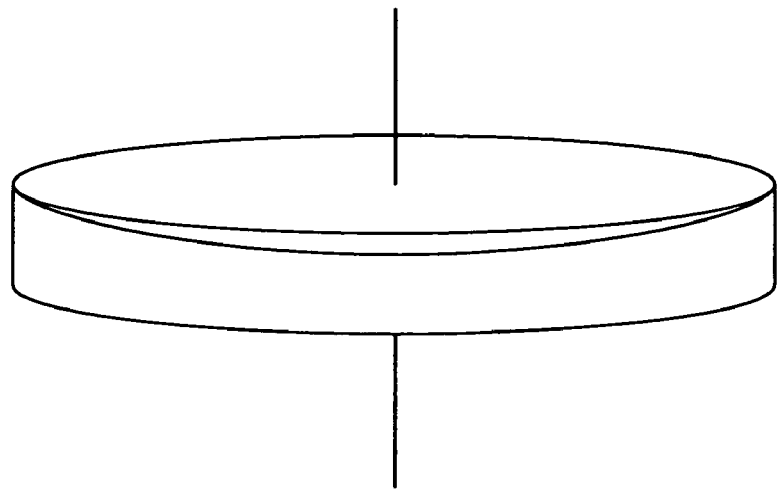
FIG. 13 is a schematic representation of a space variant optical element that can be used for varying circular birefringence in the pupil plane of the projection system according to an embodiment of the invention.

Examples of embodiments for a pupil plane polarization modifier approach include using a space variant element, e.g., an optical element such as quartz having a topographical variation or thickness increasing or decreasing quadratically in height. For example, as shown in FIG. 13, the optical element exhibits a quadratic increase of thickness from a center of the optical element towards the rim of the optical element. However, as discussed above, in order to use the circular birefringence of quartz, the crystal axis of the quartz optical element must be aligned parallel to the optical axis and the propagation angles within the quartz optical element must be collimated or confined to a few degrees. Consequently, this may limit the usable field size.

Figure 14:
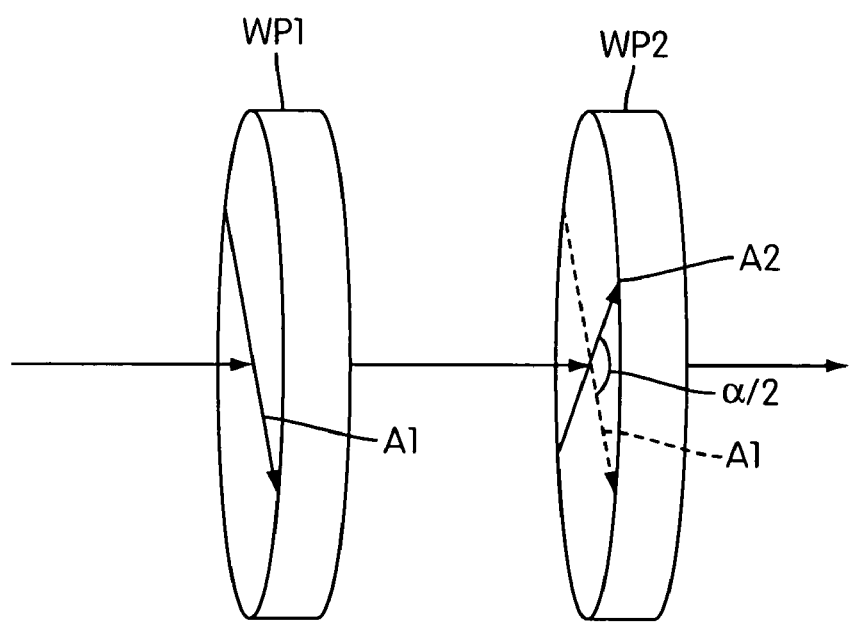
FIG. 14 is a schematic representation of a rotator that can be used for varying circular birefringence in the pupil plane of the projection system according to an embodiment of the invention.

Another embodiment for a pupil plane approach includes using a rotator, shown in FIG. 14, comprising two half-wave plates WP1 and WP2 where the respective crystal axes A1 and A2 of the two half-wave plates WP1 and WP2 enclose an angle α/2 that increases quadratically to the rim of the aperture.

Examples of embodiments for a field plane approach include using crystals with pure circular birefringence or using birefringent coatings such as diamond coatings or using right-handed and left-handed chiral thin films.

Figure 15:
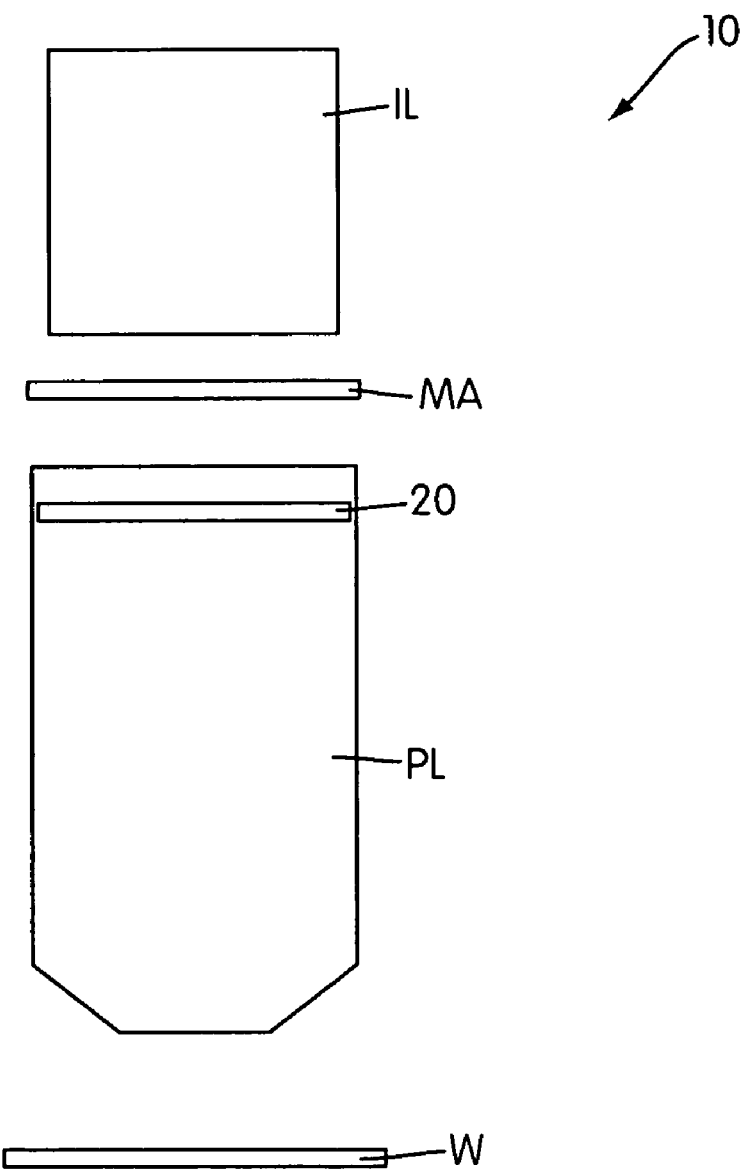
FIG. 15 schematically depicts a lithographic projection apparatus utilizing a polarization modifier according to an embodiment of the invention.

FIG. 15 shows schematically an embodiment of a lithographic apparatus utilizing a polarization modifier according to an embodiment of the present invention. As described previously, lithographic apparatus 10 comprises illumination system IL, patterning device (e.g., mask) MA, projection system PL, substrate W and a polarization modifier 20. The polarization modifier 20 is shown in this embodiment positioned at the entrance of the projection system, optimally close to the pupil plane, however, one ordinary skill in the art would appreciate that the polarization modifier 20 can be positioned anywhere in the projection system PL or outside the projection system PL such as, for example, between the patterning device MA and the projection system PL.

Furthermore, since numerous modifications and changes will readily occur to those of skill in the art, it is not desired to limit the invention to the exact construction and operation described herein. For example, while few materials exhibiting birefringence are discussed herein, it should be appreciated that other birefringent materials and/or configurations are also contemplated. Furthermore, it should be appreciated that the terms pupil plane and field plane as used herein include all conjugate planes thereof.

Moreover, the process, method and apparatus of the present invention, like related apparatus and processes used in the lithographic arts, tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. A lithographic apparatus, comprising:
a support structure configured to hold a patterning device, the patterning device configured to pattern a beam of radiation;
a substrate table configured to hold a substrate;
a projection system configured to project the beam as patterned onto a target portion of the substrate; and
a circular polarization modifier disposed in a path of the beam of radiation to modify a polarization state of the beam of radiation, the circular polarization modifier comprising a material with circular birefringence so as to increase a depth of focus of a lithographic process implemented by the apparatus.

2. The apparatus according to claim 1, wherein the circular polarization modifier comprises a rotator having the following Jones matrix:

$$J = \begin{pmatrix} \cos\beta & -\sin\beta \\ \sin\beta & \cos\beta \end{pmatrix}$$

wherein β is a rotation angle.

3. The apparatus according to claim 2, wherein $$\beta = \beta_0 \frac{p^2 + q^2}{NA^2}$$

where p and q are pupil coordinates, NA is a numerical aperture of the projection system, and $\beta_0$ is an angle of rotation at a rim of an aperture of the projection system.

4. The apparatus according to claim 2, wherein the rotator is a space variant element configured to vary an amount of rotation of a polarization of the beam radially.

5. The apparatus according to claim 4, wherein a thickness of the space variant element increases or decreases radially.

6. The apparatus according to claim 5, wherein the space variant element is formed from a material comprising quartz.

7. The apparatus according to claim 2, wherein the rotator comprises a first half-wave plate having a first axis and a second half-wave plate having a second axis, the first axis and the second axis enclosing a half angle that increases quadratically to a rim of an aperture of the projection system.

8. The apparatus according to claim 2, wherein the rotator comprises an angular variant element in which the birefringence varies in a field plane and configured to vary an amount of rotation of a polarization of the beam with an angle of propagation of the beam.

9. The apparatus according to claim 8, wherein the rotator comprises an optical element having a birefringent coating deposited thereon.

10. The apparatus according to claim 8, wherein the rotator comprises an optical element formed of right-handed and left-handed chiral thin films.

11. The apparatus according to claim 1, wherein, in use of the apparatus, a depth of focus is approximately doubled in size compared to a depth of focus obtained in a lithographic process performed with a lithographic apparatus without the polarization modifier.

12. The apparatus according to claim 1, wherein, in use of the apparatus, a critical dimension of a printed feature on the substrate is substantially symmetrical around a best focus position.

13. The apparatus according to claim 1, wherein the polarization modifier is disposed in a pupil plane of the projection system or in a vicinity of the pupil plane.

14. The apparatus according to claim 1, wherein the polarization modifier is disposed between the patterning device and the projection system.

15. A lithographic apparatus comprising:
a support structure configured to hold a patterning device, the patterning device configured to pattern a beam of radiation;
a substrate table configured to hold a substrate;
a projection system configured to project the beam as patterned onto a target portion of the substrate; and
a polarization modifier disposed in a path of the beam of radiation to modify a polarization state of the beam of radiation, the polarization modifier comprising a material having a radially continuously varying birefringence,
wherein the polarization modifier comprises an angular variant element in which the birefringence varies in a field plane and configured to vary an amount of rotation of a polarization of the beam with an angle of propagation of the beam.

16. A method for manufacturing a device, comprising:
projecting a patterned beam of radiation through a circular polarization modifier to modify a polarization state of the beam of radiation, the polarization modifier comprising a material with circular birefringence so as to increase a depth of focus of a lithographic process implemented by the apparatus, onto a target portion of a substrate.

17. The method according to claim 16, wherein the circular polarization modifier comprises a space variant element in which an amount of rotation of a polarization of the patterned beam varies radially.

18. The method according to claim 16, wherein the circular polarization modifier comprises a first half-wave plate having a first axis and a second half-wave plate having a second axis, the first axis and the second axis enclosing a half angle that increases quadratically to a rim of an aperture of a projection system used to project the patterned beam.

19. The method according to claim 16, wherein the circular polarization modifier comprises an angular variant element in which birefringence varies in a field plane and an amount of rotation of a polarization of the patterned beam varies with an angle of propagation of the patterned beam.

20. The method according to claim 16, further comprising printing a feature on the substrate, wherein a critical dimension of the printed feature is substantially symmetrical around a best focus position.

* * * * *